United States Patent
Gay et al.

(10) Patent No.: US 8,895,106 B2
(45) Date of Patent: Nov. 25, 2014

(54) PROCESS FOR COATING DISCRETE ARTICLES WITH A ZINC-BASED ALLOYED LAYER

(75) Inventors: Bruno Gay, Brussels (BE); Etienne Petit, Marly (FR)

(73) Assignee: Umicore, Brussels (BE)

( * ) Notice: Subject to any disclaimer, the term of this patent is extended or adjusted under 35 U.S.C. 154(b) by 96 days.

(21) Appl. No.: 13/147,674

(22) PCT Filed: Feb. 4, 2010

(86) PCT No.: PCT/EP2010/000684
§ 371 (c)(1),
(2), (4) Date: Nov. 2, 2011

(87) PCT Pub. No.: WO2010/089110
PCT Pub. Date: Aug. 12, 2010

(65) Prior Publication Data
US 2012/0045582 A1  Feb. 23, 2012

Related U.S. Application Data

(63) Continuation-in-part of application No. PCT/EP2009/000750, filed on Feb. 4, 2009.

(51) Int. Cl.
| C23C 16/00 | (2006.01) |
| B05D 7/14 | (2006.01) |
| B05D 3/10 | (2006.01) |
| C23C 10/06 | (2006.01) |
| C23C 14/02 | (2006.01) |
| C23C 14/16 | (2006.01) |
| C23C 14/54 | (2006.01) |

(52) U.S. Cl.
CPC ............... C23C 14/16 (2013.01); C23C 10/06 (2013.01); C23C 14/021 (2013.01); C23C 14/541 (2013.01)

USPC ........................................ 427/250; 427/248.1

(58) Field of Classification Search
None
See application file for complete search history.

(56) References Cited

U.S. PATENT DOCUMENTS

| 5,002,837 A | 3/1991 | Shimogori et al. |
| 5,747,111 A * | 5/1998 | Fukui et al. ................... 427/250 |

FOREIGN PATENT DOCUMENTS

| EP | 0730045 | 9/1996 |
| JP | 54-65141 | 5/1979 |

(Continued)

OTHER PUBLICATIONS

Kuhn, Feb. 1997, LU88730—English machine translation.*

(Continued)

*Primary Examiner* — Joseph Miller, Jr.
(74) *Attorney, Agent, or Firm* — Brinks Gilson & Lione

(57) ABSTRACT

The present disclosure concerns a process suitable for coating discrete articles with a zinc-rich, fully alloyed layer. A known method for the corrosion-protection of such articles comprises the steps of hot-dip galvannealing, typically followed by painting. This hot-dip process has however to be performed at a high temperature, thereby submitting the articles to severe thermal stress. A novel vacuum deposition process of Zn is therefore presented. It is characterized in that, in the step of contacting the article with metallic Zn vapor, the temperature of the article is equal to or higher than the dew point of the Zn vapor. The process results in a coating having a uniform thickness, even on less accessible surfaces. The surface roughness is well adapted for the adhesion of paint.

7 Claims, 1 Drawing Sheet

(56) References Cited

FOREIGN PATENT DOCUMENTS

| JP | 58-34167 | 2/1983 |
|----|----------|--------|
| JP | 59-83765 | 5/1984 |
| JP | 61-253382 | 11/1986 |
| JP | 63-004057 | 1/1988 |
| JP | 64-17853 | 1/1989 |
| JP | 2-194162 | 7/1990 |
| JP | 2-232361 | 9/1990 |
| JP | 8-134632 | 5/1996 |
| JP | 9-143682 | 6/1997 |
| LU | 88730 | 2/1997 |

OTHER PUBLICATIONS

International Search Report, issued in PCT/EP2010/000684, dated May 21, 2010.
International Preliminary Report on Patentability, issued in PCT/EP2010/000684, dated Apr. 15, 2011.

* cited by examiner

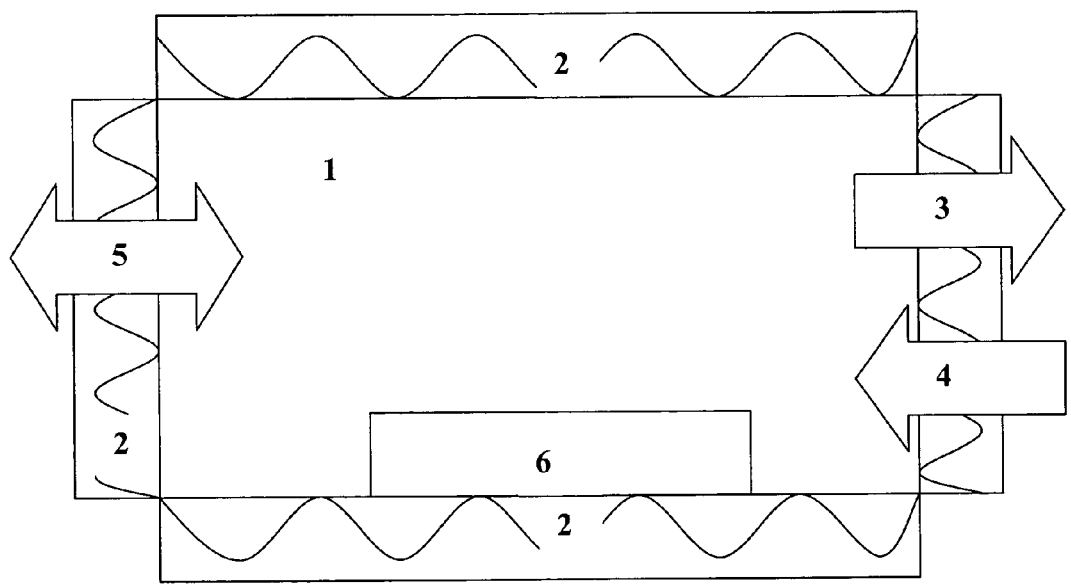

PROCESS FOR COATING DISCRETE ARTICLES WITH A ZINC-BASED ALLOYED LAYER

This application is a National Stage application of International Application No. PCT/EP2010/000684, filed Feb. 4, 2010, which is a continuation-in-part of International Application No. PCT/EP2009/000750, filed Feb. 4, 2009; the entire contents of these applications are hereby incorporated herein by reference.

The present disclosure concerns a process suitable for coating articles, and in particular discrete articles, with a zinc-rich, completely alloyed layer.

By discrete articles are meant non-continuous articles, typically having at least one concave surface. They often comprise an assembly of connected parts.

The disclosed process is suitable for applying a zinc-based protective coating on iron or steel, whereby Zn—Fe intermetallics are formed across the full thickness of the coating. This coating is similar to the layer resulting from the so-called "galvannealing" process. It differs from galvanized layers, which have Fe-free Zn at their outer surface.

A surface consisting of Zn—Fe intermetallics is preferred to a Zn surface when painting of the substrate is envisaged. It indeed offers a superior long-term paint adhesion and an excellent corrosion resistance at the interface between the paint and the Zn-bearing layer. Another advantage is the good spot welding behavior, which is important for the automotive market. However, the limited ductility of the layer should be taken into account if the product has to be further fashioned, as it is typically the case for continuous products.

In order to produce a zinc-rich, completely alloyed layer, continuous products such as sheets and wires are usually galvannealed by re-heating shortly a previously galvanized surface above the melting temperature of zinc.

JP-A-58034167 describes a typical process, whereby the continuous product is galvanized using hot-dipping in a molten Zn bath at about 465° C. When drawn out of the bath, extraneous liquid zinc on top of the galvanized layer is blown away using so called air knifes. Then, the surface is rapidly heated to up to 600° C. and kept for some time at elevated temperature so as to complete the annealing process.

According to another process divulged in JP-A-2194162, the product is galvanized in a vacuum-deposition station. A well defined quantity of Zn is deposited on a relatively cold steel substrate at a temperature of 100 to 300° C. Because of the short processing time of a few seconds only, and of the relatively low temperature of the steel, the Zn deposition mechanism is based on condensation. The galvanized product then passes a heating station for annealing to take place.

JP-A-59083765 concerns a continuous vacuum deposition process for galvanizing steel sheet. The temperature of the sheet is hereby maintained below 300° C., preferably below 200° C., in order to avoid the re-evaporation of zinc. The process is aimed at zinc plating, whereby zinc crystals are observed on the surface. The formation of Zn—Fe is not mentioned: the low processing temperatures and the relatively short residence times as normally used in continuous plating logically exclude the formation of Zn—Fe alloys.

JP-A-63004057 also concerns a continuous vacuum deposition process for galvanizing steel sheet. A 2-step process is described. A first step is carried out in a vacuum deposition chamber where Zn condensates on the sheet. Besides the condensation heat, additional heating is provided to the sheet by a winding roll. Zn—Fe alloy is then formed in a second step, which is carried out in the sheet exit chamber. This document again teaches physical condensation of Zn, as the reactive conditions for the formation of alloy are only reached afterwards.

The above processes can only be performed on continuous products having a simple geometry, such as sheets and wires. For discrete products, a batch process is used.

A completely alloyed surface can be produced on discrete products in a single step, by hot-dipping in a Zn bath at a relatively high temperature of 560 to 630° C. As Zn is particularly fluid at this temperature, the natural flow off when extracting the articles from the bath suffices to eliminate extraneous surface Zn. Nevertheless, articles are sometime centrifuged to accelerate Zn removal. The high temperature promotes the formation of Zn—Fe intermetallics across the full thickness of the coating.

However, hot dipping at such high temperatures induces potentially deleterious thermal stress in the articles. Moreover, the characteristics of the steel itself can be adversely affected. This problem is compounded by the fact that one typically hot dips a rack carrying a multitude of diverse articles, made out of different grades of steel. It then becomes impossible to define process parameters, such as bath temperature or dipping time, suitable for all articles.

The batch process according to the present invention provides an enhanced alternative to galvannealing. A uniform intermetallic coating thickness is obtained, even on articles made of different steel grades or having a complex shape. Also, the problem of the induced thermal stress is largely avoided, thanks to the inherently slower and more homogeneous heating process.

The disclosed process for coating iron or steel articles with a Zn—Fe intermetallic layer comprises the steps of:
  providing a sealable furnace, comprising a process chamber equipped with heating means, means for introducing and extracting gasses, and access ports for the article to be coated;
  taking the article to be coated into the process chamber;
  contacting the article at a temperature of 200 to 650° C. with a reducing gas in the process chamber, thereby removing surface oxidation;
  extracting gasses from the process chamber to a residual pressure of less than 1000 Pa, and preferably of less than 100 Pa;
  contacting the article at a temperature of 225 to 650° C. with metallic Zn vapor in the process chamber, thereby coating the article with a Zn—Fe intermetallic layer;
  retrieving the coated article from the process chamber.

It is further characterized in that, in the step of contacting the article with metallic Zn vapor, the temperature of the article is, preferably permanently during this step, equal to or higher than the dew point of the Zn vapor.

By dew point of the Zn vapor is meant the temperature at which the ambient partial pressure of Zn would condensate. The dew point can be derived from the partial pressure using known tables. The above-mentioned condition can e.g. be ensured in practice by providing a cold zone or cold finger in the coating reactor. By cold is meant a temperature so controlled as to be slightly below the temperature of the steel article to be coated.

In a preferred embodiment, in the step of contacting the article with metallic Zn vapor, the temperature of the article can be equal to or higher than the temperature of the Zn vapor. This relationship of temperatures will prevent Zn from condensing on the article.

The needed reducing conditions can advantageously be obtained by using a reducing gas, such as a mixture of $N_2$ and $H_2$. An article temperature of 350 to 550° C. is preferred.

In the step of contacting with metallic Zn vapor, an article temperature of 350 to 550° C. is preferred. The partial Zn partial pressure should advantageously be in the range of 1 to 500 Pa, the upper limit being determined according to the temperature of the article, and in particular so as to avoid any condensation. Higher temperatures and higher Zn partial pressures lead to faster layer growth.

The obtained products can usefully be painted. The Zn—Fe intermetallic layer offers the needed roughness to guarantee a good adherence of the paint.

Normally, articles undergo a preliminary surface preparation before entering the coating furnace. Articles are indeed often covered by oxides, from the steel hot rolling process or from their manufacturing processes. Generally, the treatment to remove this layer consists in acid pickling or shot blasting. This is performed in known ways, in dedicated apparatus. After this step, the surface is still covered by a thin layer of native oxides a few nanometers thick, due to air oxidation at room temperature. According to the present invention, the remaining oxides are reduced in a step performed within the coating furnace. This step aims at activating the reactivity of the surface towards the zinc vapor.

In the reducing gas contacting process, an article temperature of 200° C. or more is needed to ensure sufficiently fast reduction kinetics. For instance, this step can be performed at atmospheric pressure in a $N_2/H_2$ mixture in static conditions. The reduction can also be performed at low pressure, e.g. between 100 and 1000 Pa, under fast flowing gas conditions. Underpressure is useful to guarantee that no $H_2$ escapes from the furnace; overpressure will enhance the reduction kinetics. An article temperature of 350 to 550° C. is preferred.

In the Zn contacting process, an article temperature of 225° C. or more is needed to allow for the formation of Zn—Fe intermetallics. Temperatures of 350 to 550° C. are preferred, as they ensure a sufficiently fast diffusion of Fe through the layer while preserving the article from any thermal degradation.

Temperatures above 650° C., either in the process of contacting with a reducing gas or with Zn vapor, are detrimental to the economy of the process or will often lead to the thermal degradation of the articles.

Pre-heating the article before entering the coating furnace, and having the article cool down after retrieving it from the coating furnace, could shorten the process time in the vacuum furnace.

When dealing with articles having carbon or organic residues on their surface, a preliminary oxidation step with an $O_2$ containing gas could be conducted in the coating furnace.

It is believed that the deposition mechanism of Zn is not condensation, but rather reactive deposition. The Zn vapor reacts directly with surface Fe, thereby forming Zn—Fe intermetallics. The Zn—Fe phase is typically solid at the envisaged operating temperature. Also, the Zn is trapped in a stable compound. This means that there is no risk of drippage on the surface of the articles. Due to the relatively long residence time and to the high temperature of the article and of its surface, Fe and Zn tend to migrate through the intermetallic layer during the exposure to Zn. As the thickness of the alloyed layer increases, the diffusion of Fe through the layer slows down, results in a reduced reactivity of the surface towards the Zn vapor. This effect favors the growth of a layer with a uniform thickness all over the part to be coated. Layers of up to 100 μm can be grown.

An advantage of the present process is that the Sandelin effect, which deteriorates the control of the growth of intermetallic Fe—Zn compounds on Si and P bearing steels during hot dipping, is totally avoided. This effect occurs at moderate temperatures and is due to the formation of ζ phase ($FeZn_{13}$) filaments. It is assumed that the absence of any liquid Zn in the present process explains this behavior.

This process is particularly well suited for coating articles of complex shape. By this are meant articles having at least one concave surface and/or a variable cross section about all axes. Such articles also typically have regions with a thickness of more than 10 mm and/or consist of an assembly of welded parts. They often have less accessible regions such as the inner surface of tubes.

Referring to FIG. 1, the coating furnace essentially comprises:
- a gas-tight sealable process chamber (1);
- a heating device (2) to control the temperature of the articles, but also of the chamber's atmosphere and walls; this device could be inside or around the process chamber;
- a vacuum system (3), in order to extract gases such as $N_2$, $H_2$, $H_2O$, and air;
- gas injection means (4) for gases such as $N_2$, $H_2$, and air;
- access ports (5) for introducing and retrieving the articles to be treated;
- a provision (6) to introduce Zn in the process chamber; either the metal is brought directly into the chamber, or it is introduced through gas injectors connected to evaporators.

The following example illustrates the invention.

This example concerns the deposition of Zn—Fe intermetallics and Zn on hot rolled steel plates. To this end, two 100 mm by 200 mm by 3 mm steel plates are installed close to each other in the process chamber, with a gap of 10 mm between their parallel surfaces. This layout thus defines 2 outer surfaces and 2 inner surfaces, thereby simulating the difference in accessibility of surfaces on real-world, complex articles.

The following steps are performed.

Step 1: Cleaning the hot-rolled the steel samples by shot blasting, in order to remove the iron oxide layer formed in the hot rolling process.

Step 2: Introduction of samples are introduction in the coater. The coater comprises a treatment chamber (diameter 0.2 m, length 1 m) surrounded by an electrical resistance furnace (100 kW) providing homogeneous heating. This assembly resides in a vacuum chamber (1 $m^3$). 40 g of Zn is introduced in an evaporator located at the bottom of the coater.

Step 3: Vacuum suction to 0.1 mbar and introduction of reducing gases in the process chamber (5% $H_2$ and $N_2$ 95%; dew point: −30° C.; temperature: 450° C.; pressure: 0.8 bar).

Step 4: Heating of the coater and samples to 450° C. at 10° C./min.

Step 5: Reduction of the surface oxide for 600 s in the reducing gas.

Step 6: Vacuum suction to 0.03 mbar and temperature homogenization at 450° C.

Step 7: Heating of the Zn evaporator to 450° C. and stabilization for 20 minutes.

Step 8: Increasing the pressure to atmospheric, using air.

Step 9: Cooling of process chamber and samples to room temperature at 10° C./min.

Step 10: Opening of the coater and extraction of the coated steel samples.

It appears that the samples are coated on each surface, including the said inner surfaces, with a homogeneous layer formed by 50 μm of Zn—Fe intermetallics.

The invention claimed is:

1. A batch process for coating an iron or steel article with a Zn—Fe intermetallic layer, comprising:
   providing a sealable furnace, comprising a process chamber equipped with a heating component, a component for introducing and extracting gasses, and access ports for the article to be coated;
   taking the article to be coated into the process chamber;
   contacting the article at a temperature of 200 to 650° C. with a reducing gas in the process chamber, thereby removing surface oxidation;
   extracting gasses from the process chamber to a residual pressure of less than 1000 Pa;
   contacting the article at a temperature of 225 to 650° C. with metallic Zn vapor in the process chamber, thereby coating the article with a Zn—Fe intermetallic layer;
   retrieving the coated article from the process chamber;
   wherein when contacting the article with metallic Zn vapor, the temperature of the article is equal to or higher than the dew point of the Zn vapor.

2. The process of claim 1, wherein when contacting the article with metallic Zn vapor, the temperature of the article is equal to or higher than the temperature of the Zn vapor.

3. The process of claim 1, wherein the reducing gas comprises $H_2$.

4. The process of claim 3, wherein the reducing gas comprises a $N_2/H_2$ mixture.

5. The process of claim 1, wherein when contacting the reducing gas, the article is at a temperature of 350 to 550° C.

6. The process of claim 1, wherein when contacting with metallic Zn vapor, the article is at a temperature of 350 to 550° C.

7. The process of claim 1, wherein after retrieving the coated article, the article is painted.

* * * * *